(12) United States Patent
Inomata et al.

(10) Patent No.: US 7,459,098 B2
(45) Date of Patent: *Dec. 2, 2008

(54) DRY ETCHING APPARATUS, DRY ETCHING METHOD, AND PLATE AND TRAY USED THEREIN

(75) Inventors: Yosuke Inomata, Yokaichi (JP); Yuko Fukawa, Yokaichi (JP)

(73) Assignee: Kyocera Corporation, Kyoto (JP)

( * ) Notice: Subject to any disclaimer, the term of this patent is extended or adjusted under 35 U.S.C. 154(b) by 255 days.

This patent is subject to a terminal disclaimer.

(21) Appl. No.: 10/650,504

(22) Filed: Aug. 27, 2003

(65) Prior Publication Data

US 2004/0079725 A1   Apr. 29, 2004

(30) Foreign Application Priority Data

Aug. 28, 2002 (JP) ............................. 2002-249672
Aug. 29, 2002 (JP) ............................. 2002-252153

(51) Int. Cl.
*H01L 21/302* (2006.01)

(52) U.S. Cl. ............................. 216/37; 216/41; 216/42; 216/67; 438/714

(58) Field of Classification Search ................. None
See application file for complete search history.

(56) References Cited

U.S. PATENT DOCUMENTS

| | | | | |
|---|---|---|---|---|
| 3,982,976 A | * | 9/1976 | Marciniec | ................... 438/16 |
| 4,243,506 A | | 1/1981 | Ikeda et al. | ............ 204/298.31 |
| 4,523,971 A | | 6/1985 | Cuomo et al. | .......... 156/345.39 |
| 4,661,203 A | | 4/1987 | Smith et al. | ................. 438/725 |
| 4,681,780 A | | 7/1987 | Kamman | ................... 427/282 |
| 4,771,213 A | | 9/1988 | Higashinakagawa et al. | .......................... 313/402 |
| 4,810,322 A | * | 3/1989 | Gut et al. | ............... 156/345.39 |
| 4,842,679 A | | 6/1989 | Kudo et al. | ................. 438/707 |
| 5,015,331 A | | 5/1991 | Powell | ........................ 438/723 |
| 5,171,732 A | | 12/1992 | Hed | ............................ 505/190 |
| 5,223,108 A | | 6/1993 | Hurwitt | .................. 204/192.12 |
| 5,248,371 A | | 9/1993 | Maher et al. | |
| 5,254,215 A | | 10/1993 | Terakado et al. | ............... 216/63 |

(Continued)

FOREIGN PATENT DOCUMENTS

DE        1 621 342        5/1971

(Continued)

OTHER PUBLICATIONS

German language office action and its English language translation for corresponding German application No. 10340750.2 lists the reference below, Jun. 27, 2006.

(Continued)

*Primary Examiner*—Anita K Alanko
(74) *Attorney, Agent, or Firm*—Hogan & Hartson LLP

(57) ABSTRACT

A dry etching apparatus that performs etching on a substrate 1 placed on a tray 13 inside a chamber 18 by covering the substrate 1 with a plate 14 provided with opening portions 15, in which a distance D between the surface opposing the substrate 1 and the substrate 1 in the peripheral portion of the plate 14 is set shorter than the distance D between the surface opposing the substrate 1 and the substrate 1 in the central portion of the plate 14. Textures can be thus formed homogeneously on the surface of the substrate.

7 Claims, 6 Drawing Sheets

U.S. PATENT DOCUMENTS

| | | | |
|---|---|---|---|
| 5,304,250 A | 4/1994 | Sameshima et al. ... 118/723 ER |
| 5,332,464 A | 7/1994 | Namose .......................... 438/9 |
| 5,417,798 A | 5/1995 | Nishibayashi et al. |
| 5,503,881 A * | 4/1996 | Cain et al. ................... 438/716 |
| 5,665,167 A * | 9/1997 | Deguchi et al. ............. 118/728 |
| 5,679,436 A | 10/1997 | Zhao |
| 5,693,234 A | 12/1997 | Peters ........................... 216/2 |
| 5,753,014 A | 5/1998 | Van Rijn ........................ 96/12 |
| 5,764,842 A | 6/1998 | Aoki et al. ................... 385/131 |
| 5,770,123 A | 6/1998 | Hatakeyama et al. ...... 264/1.21 |
| 5,868,952 A | 2/1999 | Hatakeyama et al. ......... 216/66 |
| 5,968,275 A * | 10/1999 | Lee et al. ................. 118/723 R |
| 5,990,016 A | 11/1999 | Kim et al. |
| 6,087,274 A | 7/2000 | Tonucci et al. .............. 438/758 |
| 6,132,805 A | 10/2000 | Moslehi ................... 427/248.1 |
| 6,171,351 B1 | 1/2001 | Schroder et al. .............. 51/295 |
| 6,176,967 B1 * | 1/2001 | Obszarny ................. 156/345.3 |
| 6,214,161 B1 * | 4/2001 | Becker et al. .......... 156/345.48 |
| 6,261,406 B1 * | 7/2001 | Jurgensen et al. ........ 156/345.3 |
| 6,316,289 B1 | 11/2001 | Chung ........................ 438/118 |
| 6,413,880 B1 | 7/2002 | Baski et al. ................. 438/759 |
| 6,418,941 B1 | 7/2002 | Arita et al. .................... 134/1.2 |
| 2001/0006169 A1 | 7/2001 | Hogan et al. |
| 2001/0036744 A1 | 11/2001 | Taravade et al. |
| 2002/0011215 A1 | 1/2002 | Tei et al. |
| 2002/0168166 A1 | 11/2002 | Itoh et al. ................... 385/129 |
| 2005/0011447 A1 * | 1/2005 | Fink ............................ 118/715 |
| 2005/0241583 A1 * | 11/2005 | Buechel et al. .......... 118/723 E |
| 2005/0251990 A1 * | 11/2005 | Choi et al. .................... 29/558 |
| 2006/0060138 A1 * | 3/2006 | Keller et al. ................. 118/715 |

FOREIGN PATENT DOCUMENTS

| | | |
|---|---|---|
| EP | 0 399 998 | 5/1990 |
| JP | 58-032417 | 2/1983 |
| JP | 59219464 A * | 12/1984 |
| JP | 61238981 A * | 10/1986 |
| JP | 62047132 A * | 2/1987 |
| JP | 62277730 A * | 12/1987 |
| JP | 01-119025 | 5/1989 |
| JP | 02106925 A * | 4/1990 |
| JP | 06-204181 | 7/1994 |
| JP | 07-500459 | 1/1995 |
| JP | 08-274069 | 10/1996 |
| JP | 09-501271 | 2/1997 |
| JP | 09-102625 | 4/1997 |
| JP | 09-283493 | 10/1997 |
| JP | 09-320799 | 12/1997 |
| JP | 10-223736 | 8/1998 |
| JP | 10-280172 | 10/1998 |
| JP | 11317396 A * | 11/1999 |
| JP | 2001-127142 | 5/2001 |
| JP | 2002-076404 | 3/2002 |
| WO | WO 94/05035 | 3/1994 |
| WO | 99/56324 | 11/1999 |
| WO | 00/26945 | 5/2000 |
| WO | 02/09198 | 1/2002 |

OTHER PUBLICATIONS

Meyers Enzyklopadisches Lexicon Band 10: Gem-Gror p. 401 (1974), no month available.

German language office action and its English language translation for corresponding German application 10340751.0-54 lists the reference above, Jun. 9, 2008.

* cited by examiner

DRY ETCHING APPARATUS, DRY ETCHING METHOD, AND PLATE AND TRAY USED THEREIN

This application is based on application Nos. 2002-249672 and 2002-252153 filed in Japan, the content of which is incorporated hereinto by reference.

BACKGROUND OF THE INVENTION

1. Field of the Invention

The present invention relates to a dry etching apparatus, a dry etching method, and a plate and a tray used therein, and more particularly to a dry etching apparatus and a dry etching method suitable for use in texturing the surface of a silicon solar cell substrate or the like, and to a plate and a tray used therein.

2. Description of the Related Art

A solar cell is an element that converts incident light energy into electrical energy. The solar cell is classified into crystal-based, amorphous-based, and compound-based solar cells depending on materials used. Among others, crystalline silicon solar cells account for a large percentage of the solar cells currently available on the market. The crystalline silicon solar cell is further classified into a single-crystalline silicon type and a multi-crystalline silicon type. A silicon solar cell of a single-crystal type has an advantage that efficiency can be readily improved due to the substrate of high quality, but has a drawback that the manufacturing cost of the substrate is high. On the contrary, a multi-crystalline silicon solar cell has a drawback that efficiency cannot be readily improved due to the substrate of inferior quality, but has an advantage that the manufacturing cost is low. In addition, improvement in quality of the multi-crystalline silicon substrate and advancement in the cell fabrication technique in recent years made it possible to achieve conversion efficiency of approximately 18% in the research level.

On the other hand, while multi-crystalline silicon solar cells have been available on the market because they can be manufactured at a low cost through mass-production, the demand is now on the increase due to growing concern about environmental issues in recent years, and there is a need to achieve higher conversion efficiency at a low cost.

There have been made many attempts regarding solar cells to improve conversion efficiency to electrical energy. One of such attempts relates to a technique to reduce reflection of light incident on the substrate, by which conversion efficiency to electrical energy can be improved by reducing reflection of light on the surface.

In a case where a solar cell is fabricated from a silicon substrate, reflection can be reduced to some extent by etching the surface of the substrate with alkaline aqueous solution, such as sodium hydroxide, to form fine textures (concavities and convexities) on the surface of the substrate. In a case where a single-crystalline silicon substrate having a (100)-plane orientation, a group of myriads of pyramids called a texture structure can be formed on the surface of the substrate by the method described above.

Etching with the use of alkaline aqueous solution, however, depends on the plane orientation of crystals, and for this reason, in a case where a solar cell is fabricated from a multi-crystalline silicon substrate, a group of pyramids cannot be formed homogeneously, which raises a problem that overall reflectance cannot be reduced effectively. When the textures cannot be formed homogeneously, incident light cannot be taken into the solar cell effectively, and the solar cell has little hope of improving photoelectrical conversion efficiency.

In order to eliminate such a problem, there has been proposed an idea of texturing the surface by forming fine textures through the reactive ion etching method when a solar cell element is fabricated from multi-crystalline silicon (see Japanese Laid-Open Patent Application No. 102625/1997, etc.). In other words, this idea is to reduce reflectance of a solar cell using multi-crystalline silicon more effectively by forming fine texture homogeneously on multi-crystalline silicon regardless of anomalous plane orientations of the crystals.

A substrate processing apparatus used in the reactive ion etching method is generally of a parallel plate counter-electrode type, wherein an RF voltage plate is provided on the side where the substrate is placed and the electrode on the other side and the internal sidewall are connected to ground. The interior of the chamber is evacuated, then the substrate is added by the RF voltage and is subjected to plasma etching while a constant pressure is maintained by introducing an etching gas, and a pressure in the interior of the chamber is restored to atmospheric pressure after the etching is completed.

Because of the procedure described above, waiting times for evacuation and leaking to atmospheric pressure are long in a reactive ion etching apparatus. Moreover, the area of the solar cell itself is large. Hence, there is a problem that the manufacturing cost of a solar cell is increased because only a small number of substrates can be processed at a time.

Accordingly, in the case of using a reactive ion etching apparatus in the fabrication sequence of a solar cell, a way in which the number of substrates to be processed at a time is increased at high tact while ensuring homogeneity of textures formed the surface of the substrate, or a way in which the area of a substrate to be processed is increased is crucial.

However, further increment of an area to be processed at a time gives rise to adverse influence on the homogeneity of the textures. In particular, in the case of an apparatus with an etching area larger than 1 $m^2$, it is difficult to ensure the homogeneity.

More specifically, there arises a problem that etching takes place in the peripheral portion of the etching region on the substrate, but the textures are not readily formed.

It is therefore an object of the invention to provide a dry etching apparatus and a dry etching method that make it possible to form textures homogeneously on the surface of a substrate, and a plate and a tray used therein.

BRIEF SUMMARY OF THE INVENTION

A dry etching apparatus according to the invention is characterized by including: a chamber; a tray provided inside the chamber; a substrate to be etched, placed on a substrate-placing surface of the tray; and a plate provided with a number of opening portions and prepared to cover the substrate to be etched, wherein the plate is arranged in such a manner that, while covering the substrate to be etched, a distance between a surface opposing the substrate to be etched and the substrate to be etched in a peripheral portion is shorter than a distance between the surface opposing the substrate to be etched and the substrate to be etched in a central portion.

According to this dry etching apparatus, in a case where a substrate, placed on the tray, is provided on the electrode inside the chamber to be etched while being covered with the plate provided with a number of opening portions, the distance between the substrate and the plate in the peripheral portion of the plate is shorter than the distance between the substrate and the plate in the central portion of the plate. This arrangement makes it easier to trap residues generated during etching in a space between the plate and the substrate, in the peripheral portion of the etching region. Hence, the formation of textures can take place easier also in the peripheral portion of the substrate, which makes it possible to form the textures homogeneously across the entire surface of the substrate.

Another dry etching apparatus according to the invention is characterized by including: a chamber; a tray provided inside the chamber; a substrate to be etched, placed on a substrate-placing surface of the tray; and a plate provided with a number of opening portions and prepared to cover the substrate to be etched, wherein the plate is provided with a protruding wall on a surface opposing the substrate to be etched.

According to this dry etching apparatus, in a case where the surface of a substrate is textured by placing the plate provided with a number of opening portions to cover the substrate placed on the tray inside the chamber, the residues generated during etching can be trapped in a space between the plate and the substrate due to the protruding wall provided to the plate on the surface opposing the substrate. Textures can be thus formed efficiently and homogenously on the surface of the substrate.

The inventions described above are particularly effective when etching the substrate of a large area larger than 1 m$^2$. However, the inventions can be used effectively when an etching area is small. In particular, the inventions are effective when there is a problem in hardware that the homogeneity cannot be improved sufficiently by changing the other etching conditions.

DETAILED DESCRIPTION OF THE INVENTION

The following description will describe in detail embodiments of the invention with reference to the accompanying drawings.

Figure 1:
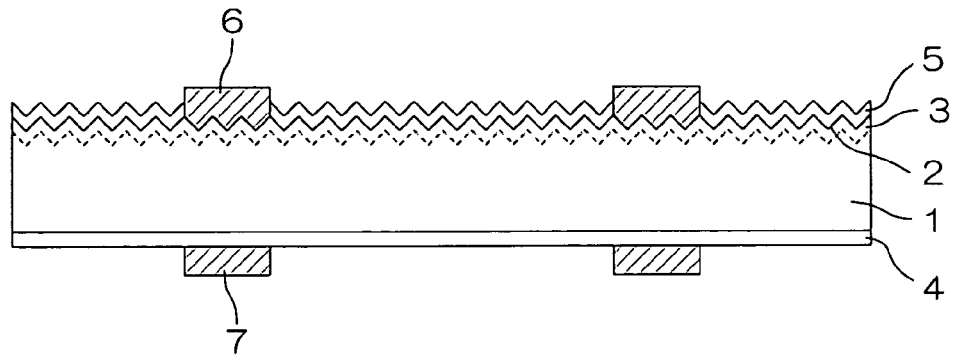
FIG. 1 is a cross section showing a solar cell fabricated from a substrate done with surface texturing with the use of a dry etching apparatus of the invention.

FIG. 1 is a view showing a structure of a solar cell fabricated with the use of a dry etching apparatus of the invention. Numeral 1 denotes a silicon substrate, numeral 2 denotes textures formed on the silicon substrate 1, numeral 3 denotes an impurity diffusing layer on the light-reception surface, numeral 4 denotes an impurity diffusing layer (BSF) on the back surface, numeral 5 denotes an anti-reflection layer formed on the textures 2, numeral 6 denotes a surface electrode, and numeral 7 denotes a back surface electrode.

The silicon substrate 1 is a single-crystalline or multi-crystalline silicon substrate. The substrate is of either a p-type or an n-type. The silicon substrate 1 is formed through the Czochralski method or the like in the case of single-crystalline silicon, and through casting process or the like in the case of multi-crystalline silicon. Multi-crystalline silicon is quite advantageous over single-crystalline silicon in terms of the manufacturing costs because it can be mass-produced. An ingot made through the Czochralski method or the casting process is sliced at a thickness of approximately 300 μm, and cut into a silicon substrate of a size of approximately 15 cm×15 cm.

The textures 2 are formed on the surface of the silicon substrate 1 to effectively absorb incident light. Also, on the surface of the silicon substrate 1 is formed the impurity diffusing layer 3 in which a reverse conduction type semiconductor impurity is diffused. The impurity diffusing layer 3 is provided to form a semiconductor junction inside the silicon substrate 1. The reverse conduction type impurity diffusing layer 3 is formed at a depth of approximately 0.1 to 0.5 μm.

The anti-reflection layer 5 is formed on the surface of the silicon substrate 1. The anti-reflection layer 5 is provided to take light inside the substrate 1 effectively by preventing light from reflecting on the surface of the silicon substrate 1. The anti-reflection layer 5 is formed of a silicon nitride (SiN) film, a silicon dioxide (SiO_) film or the like having a thickness of approximately 500 to 2000 A.

It is preferable to form the diffusing layer 4 on the back surface side of the silicon substrate 1, in which a one conduction type impurity is diffused at a high concentration. The impurity diffusing layer 4 is provided to induce an intrinsic electric field on the back surface of the silicon substrate 1 in preventing deterioration of efficiency due to recombination of carriers taking place near the back surface of the silicon substrate 1.

The surface electrode 6 and the back surface electrode 7 are formed respectively on the surface and the back surface of the silicon substrate 1. The surface electrode 6 and the back surface electrode 7 are formed, for example, by sintering screen-printed Ag paste and by coating the top with a solder layer (not shown).

As has been described, the fine textures 2 are formed on the surface of the silicon substrate 1 to take incident light effectively inside.

Figure 2:
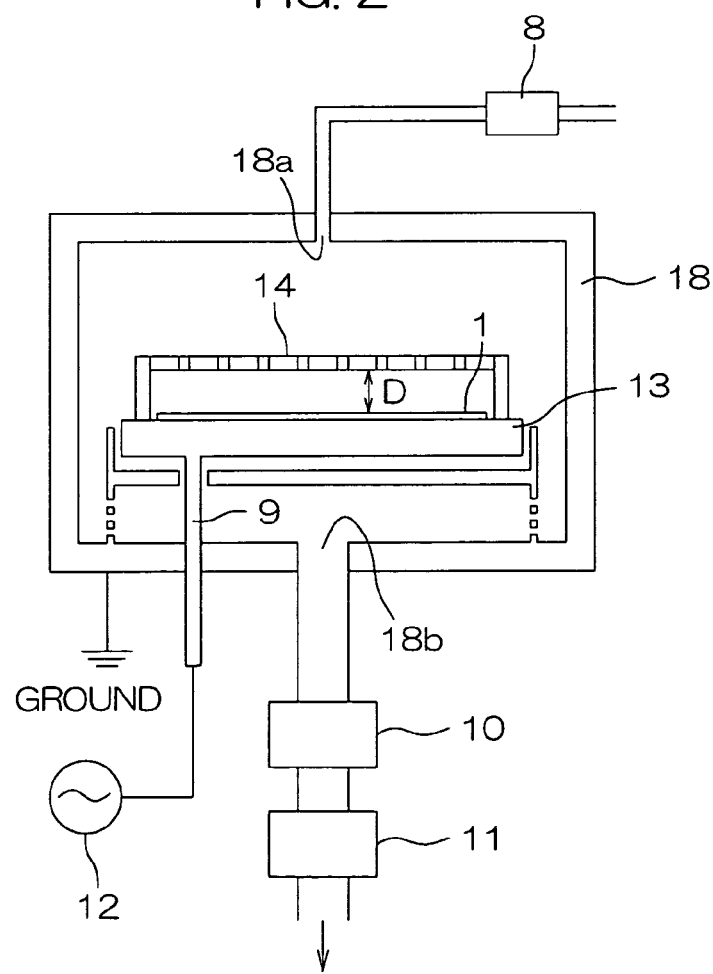
FIG. 2 is a view showing a basic structure of the dry etching apparatus.
Figure 3:
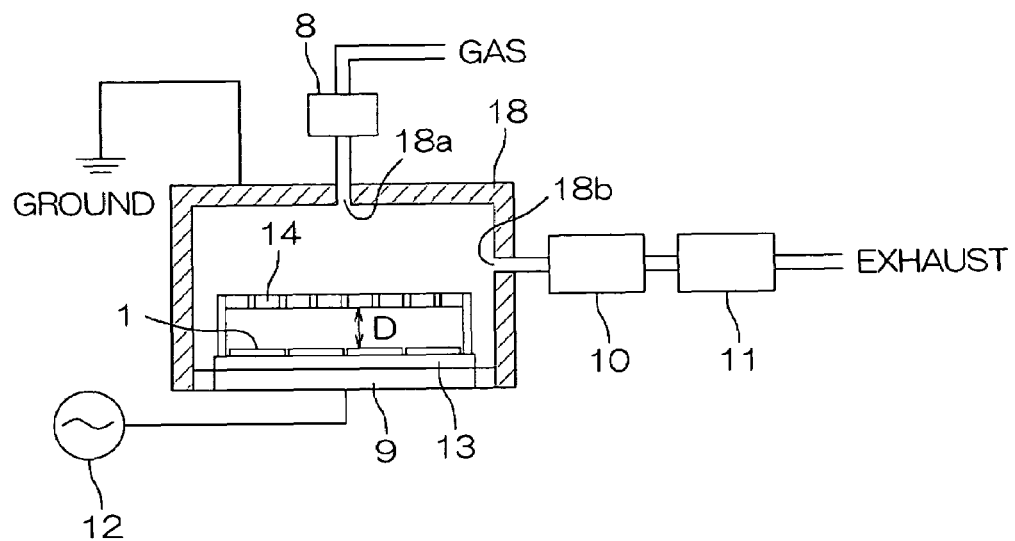
FIG. 3 is a view showing another basic structure of the dry etching apparatus.

Referring to FIG. 2 and FIG. 3, the textures 2 are formed as follows: a gas is kept introduced into an evacuated etching chamber 18 to maintain a constant pressure, and plasma is generated by applying RF power to an electrode 9 provided inside the chamber 18, so that the surface of the substrate 1 is etched by the action of resulting activated seeds, such as ions and radicals. This method is referred to as the reactive ion etching (RIE) method.

Referring to FIG. 2 and FIG. 3, numeral 8 denotes a mass-flow controller that controls the flow of a gas introduced inside the chamber 18, numeral 1 denotes a silicon substrate, numeral 9 denotes the RF electrode, numeral 10 denotes a pressure controller, numeral 11 denotes a vacuum pump, numeral 12 denotes an RF power supply, numeral 13 denotes a tray, alpha-numeral 18a denotes an inlet port introducing a gas inside the chamber 18, and alpha-numeral 18b denotes an exhaust port.

Plasma is generated by introducing an etching gas as well as an etching-residue producing gas into the apparatus from the massflow controller 8 while introducing RF power from the RF electrode 9 to excite and activate ions and radicals. The surface of the silicon substrate 1 placed on the top portion of the RF electrode 9 is then etched by the action of the ions and radicals.

According to the apparatus shown in FIG. 2, the surface of a single silicon substrate 1 is etched by providing the RF electrode 9 inside the apparatus. On the contrary, according to the apparatus shown in FIG. 3, the surfaces of a plurality of silicon substrates 1 are etched concurrently by providing the RF electrode 9 on the outside wall of the apparatus.

A method in which, of all the generated activated seeds, the effect of etching by the action of ions is enhanced is generally referred to as the reactive ion etching method. The plasma etching method is known as a similar method. The reactive ion etching method is characterized in that distributions of the kinds of activated seeds acting on the substrate 1 are changed depending on the chamber structure, the electrode structure, a generation frequency or the like, and is basically the same as the plasma etching method in the principle of generating plasma. The invention is therefore effective not only to the reactive ion etching method, but also to the dry etching method in general including the plasma etching method.

According to the dry etching apparatus of the invention, etching is performed by applying RF power needed to generate plasma and holding the silicon substrate 1 on the RF electrode 9 for a predetermined time with a reaction pressure being controlled by flowing, for example, a fluorine-based gas, a chlorine-based gas, oxygen, etc. The textures 2 are thereby formed on the surface of the silicon substrate 1.

Basically, during etching, silicon evaporates upon being etched, part of which, however, does not evaporate completely and molecules bond to one another, thereby being left as residues on the surface of the substrate 1. In other words, when the surface of the silicon substrate 1 is textured through the reactive ion etching method or a similar dry etching method, etching residues, chiefly composed of etched silicon, are allowed to re-attach to the surface of the silicon substrate 1.

In the invention, a re-attaching rate is accelerated, so that the textures 2 are formed on the surface of the silicon substrate 1 by using the residues as a micro-mask for etching. It should be noted that the etching residues are removed in the end.

The textures 2 can be formed in a reliable manner by setting a gas condition, a reaction pressure, RF power, etc. to comply with the conditions under which the residues of silicon will be left on the surface of the silicon substrate 1. It should be noted, however, that an aspect ratio of the textures 2 needs to be optimized. It is difficult to form the textures 2 under any condition such that the residues of silicon will not be left on the surface of the substrate 1.

When etching is performed with the use of the dry etching apparatus of the invention, the silicon substrate 1 is covered with a plate 14 provided with a number of opening portions 15 (see FIG. 2 and FIG. 3). The generation of residues is promoted through etching with the use of such a plate 14, which in turn accelerates the formation of the textures 2.

Figure 4:
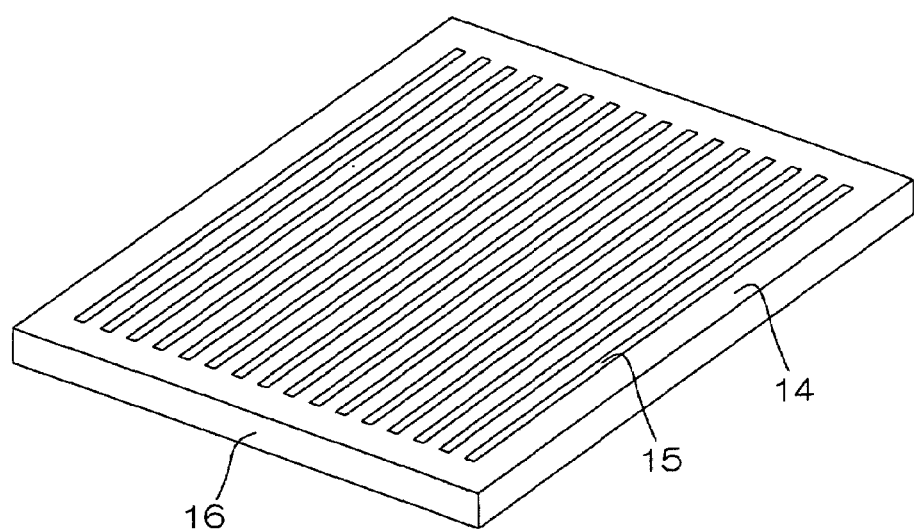
FIG. 4 is a perspective view showing a plate for use in a dry etching apparatus.

FIG. 4 is a schematic perspective view showing one example of the plate 14. According to the drawing, the opening portions 15 are shaped like elongate slits aligned in parallel. However, the opening portions 15 are not limited to the shape of slits, and can be of an arbitrary shape. A matrix pattern of circular openings may be adopted, or a zigzag pattern of a number of dot-like openings may be adopted. The opening portions 15 may comprise rectangular holes. It should be noted, however, that the presence of a non-opening portion of a large area gives rise to unevenness in etching below such a portion.

It is also preferable that an open area ratio, which is a ratio of the opening portions 15 with respect to the entire area of the plate 14, is approximately 5 to 40%. When the open area ratio is less than 5%, a gas needed to etch silicon is not supplied sufficiently, and a residue forming rate is reduced, which in turn slows down the formation of textures. Conversely, when the open area ratio is greater than 40%, the effect of trapping residues, generated during etching and composed of silicon compounds, in a space between the plate 14 and the substrate 1 is reduced, and so is the effect of forming the residues.

It is preferable to perform etching while keeping a distance D between the plate 14 and the silicon substrate 1 to 5 mm to 30 mm. When arranged in this manner, there can be achieved an effect that silicon compounds, produced and evaporating during etching, can be trapped inside a space between the silicon substrate 1 and the plate 14, which makes it easier for residues, chiefly composed of silicon, to be generated on the silicon substrate 1. Hence, not only the generation of residues, but also the formation of the textures 2 can be promoted at the same time.

When the distance D between the plate 14 and the silicon substrate 1 is less than 5 mm, the opening portions 15 in the plate 14 are transferred as a pattern on the surface of the silicon substrate 1 when the textures are formed, thereby leaving unevenness on the surface. Conversely, when the distance D is greater 30 mm, the effect of generating the residues faster to promote the formation of the textures is reduced. Hence, although etching takes place, the textures are not readily formed.

As a method of maintaining the distance D between the plate 14 and the silicon substrate 1, as shown in FIG. 4, a simple method is to maintain a distance by providing a sidewall portion 16 to the plate 14.

In a case where an etching area is larger than 1 m$^2$, the plate 14 of a large area is manufactured, but the plate 14 bends due to self-weight. Also, because plasma used for etching heats the plate 14, the plate 14 may further deform due to self-weight. Hence, the larger the area of the silicon substrate 1, the more difficult it becomes to control exactly a distance between the silicon substrate 1 and the plate 14. In such a case, an effective countermeasure is to increase the rigidity by increasing the thickness of the plate 14 or to increase the height of the sidewall portion 16. A method to reduce the thickness, and hence the weight of the plate 14 at the center is also effective. In this case, the thickness of the plate 14 can be set in relation with the strength, material costs, etching conditions, etc.

The plate 14 is made of either aluminum or glass.

When the readiness in processing is concerned, metal is preferable as a material of the plate 14. In particular, it is preferable to use metal when an etching area is large because glass is so brittle that it readily breaks. However, a material based on stainless or the like is not suitable because it corrodes when exposed to a gas used to etch silicon.

The plate 14 generates heat because it is exposed to plasma during etching. Although the extent of rise in temperature varies greatly with the conditions, because of the sequence that the temperature of the plate 14 rises in plasma, then the plate 14 is allowed to stand until it is cooled to normal temperature once the textures are formed, and the substrate is taken out in atmosphere, a material that can withstand a temperature difference is preferred for the plate 14.

Considering the processing performance such that allows various kinds of processing on the plate 14, and a small self-weight needed to reduce distortion of the plate 14 as well as corrosion resistance to a gas used for etching, it is particularly preferable to use a plate 14 made of aluminum in the invention.

An explanation was given to a silicon substrate as a substrate to be etched by way of example. However, applications of the invention are not limited to a silicon substrate, and the invention can be applied to a substrate or a sheet made of glass, plastic, ceramic, etc.

<Shape A Characteristic to Plate>

Incidentally, one of the factors to form the textures through dry etching with the use of plasma is to accelerate positive-charge-carrying ions generated by plasma with an electric field so as to be incident on the surface of a substrate in a perpendicular direction.

In particular, in the case of a large-scaled apparatus with an etching area larger than 1 $m^2$, the textures are formed faster in the central portion and slower in the peripheral portion. Regardless of the fact that the textures are formed slower in the peripheral portion, a quantity of etching in the peripheral portion is greater or nearly equal to that in the center portion. This reveals that a gas sufficient to etch the substrate is supplied to the peripheral portion; however, the effect of ions incident on the substrate through the interplay of the electric field and the ions is smaller than in the central portion. This is thought as one of the reasons causing a problem that etching takes place but textures are not readily formed in the peripheral portion of the etching region inside the apparatus.

Another factor to form the textures is a residue forming rate. The formation of textures can be accelerated by accelerating the formation of the residues.

Thus, the problem that the formation of the textures is slow in the peripheral portion is thought to be solved by accelerating the formation of residues. The invention uses, as such means, a method of controlling the distance D between the plate 14 and the silicon substrate 1. When the distance D between the plate 14 and the silicon substrate 1 is large, the effect of trapping the silicon residues generated during etching in a space between the plate 14 and the substrate 1 is small, and so is the effect of promoting the formation of residues, which in turn slows down the formation of the textures. Conversely, when the distance D is small, the trapping effect is increased, and the formation of residues is promoted, which in turn accelerates the formation of the textures.

In other words, in solving the problem that the texture forming rate is slow in the peripheral portion, it is structured in such a manner that the distance D between the plate 14 and the silicon substrate 1 becomes shorter in the peripheral portion than in the central portion of the plate 14. According to this structure, the residue forming rate in the peripheral portion is accelerated, and the texture forming rate in the peripheral portion can be improved.

Figure 5:
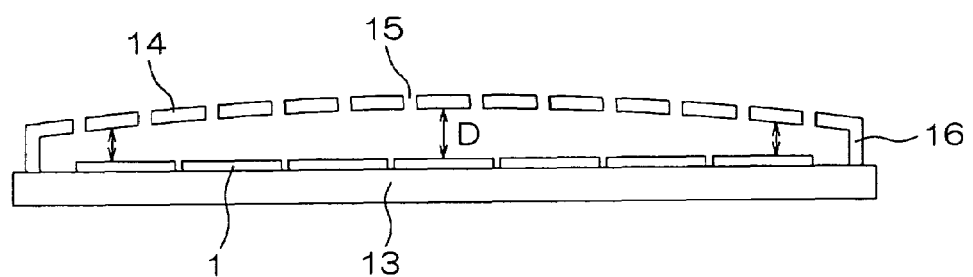
FIG. 5 is a cross section showing a state where the plate of the invention is provided.
Figure 6:
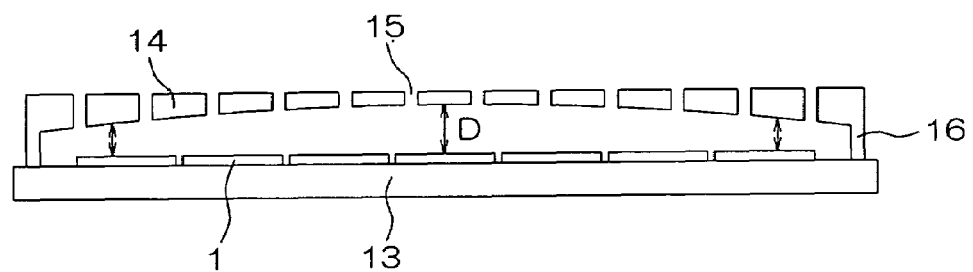
FIG. 6 is a cross section showing a state where another plate of the invention is provided.
Figure 7:
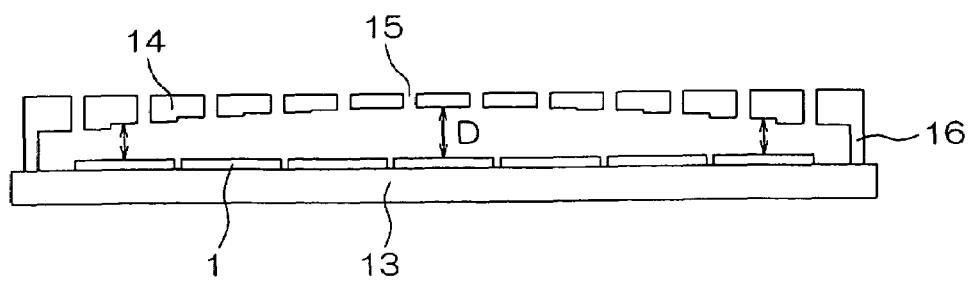
FIG. 7 is across section showing a state where still another plate of the invention is provided.

FIG. 5 through FIG. 7 are cross sections of the plate 14 according to one embodiment of the invention. Numeral 13 denotes a tray, numeral 1 denotes a silicon substrate placed on the tray 13, and numeral 14 denotes the plate. The plate 14 is provided with a number of opening portions 15.

As shown in FIG. 5 through FIG. 7, it is structured in such a manner that the distance D between the plate 14 and the silicon substrate 1 is shorter in the peripheral portion than in the central portion of the plate 14.

A concrete method of varying the distance D between the plate 14 and the silicon substrate 1 is, for example, as shown in FIG. 5, to provide curved planes to the plate 14, and to place the plate 14 with the concave plane side being opposed to the silicon substrate 1. As shown in FIG. 6, a structure such that only the inner surface of the plate 14 forms a concave plane as a whole by increasing the thickness of the plate 14 from the central portion to the peripheral portion. A structure such that the inner surface of the plate 14 forms a cone or a pyramid is also effective.

The inner surface of the plate 14 is not necessarily formed of a curved plane. It is sufficient that the entire inner surface forms a concave or nearly concave plane. As shown in FIG. 7, a concave or nearly concave plane may have a step-like structure comprising a plurality of planes.

Figure 8:
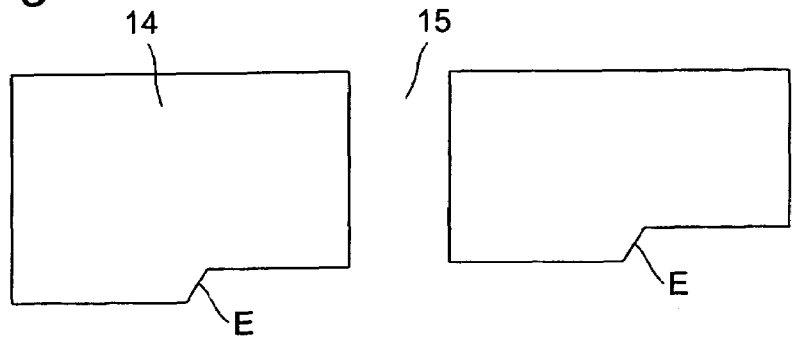
FIG. 8 is an enlarged view of the plate of FIG. 7.

FIG. 8 is an enlarged cross section of the plate 14 of FIG. 7. The internal surface of the plate 14 comprises planes provided with steps E. The steps E shape the internal surface into a concave or nearly concave plane as a whole. As shown in an enlarged view of FIG. 8, it is preferable to apply chamfering to the step portions E to reduce the possibility of the occurrence of an abnormal discharge. The chamfering can reduce the possibility of the occurrence of an abnormal discharge induced by protrusions formed at the steps.

The outer surface (the surface that does not oppose the substrate) of the plate 14 can be a curved plane as shown in FIG. 5 or a flat surface as shown in FIG. 6 and FIG. 7. Alternatively, it may form a step-like structure like the internal surface of FIG. 7.

Figure 9A:
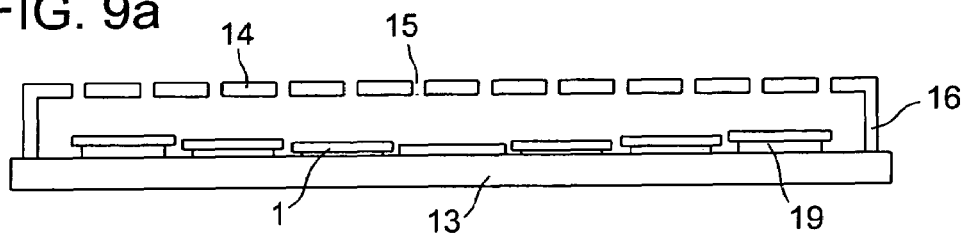
FIGS. 9a, 9b and 9c are across-section showing states where still other plates of the invention are provided.
Figure 9B:
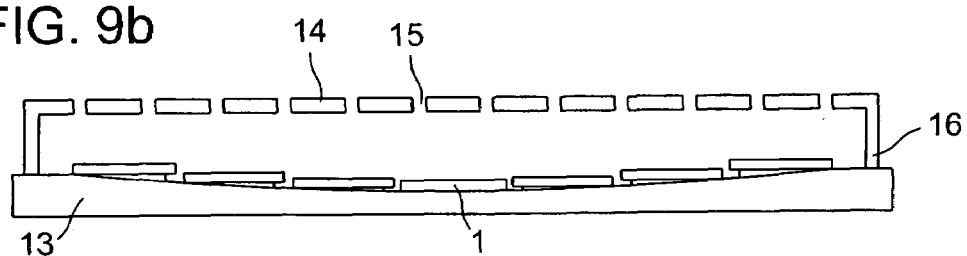
Figure 9C:
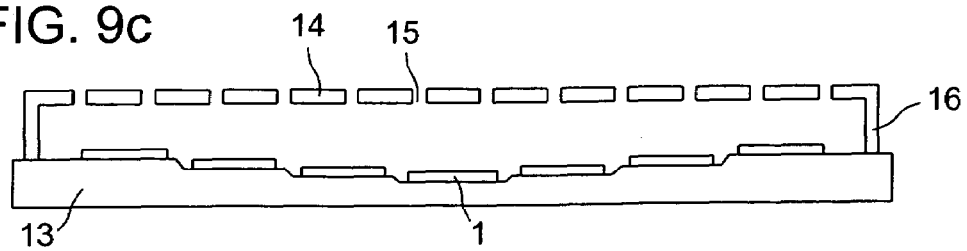

Also, it may be structured as shown in FIG. 9 as another embodiment of the invention, wherein a plurality of silicon substrates 1 are prepared, and the silicon substrates 1 are placed in closer proximity to the plate 14 in the peripheral portion than in the central portion of the plate 14, so that the placing surface for the silicon substrate 1 forms a concave or nearly concave plane as a whole. This structure can be achieved by disposing a pad 19 or the like between the silicon substrates 1 and a tray 13 in the peripheral portion and thereby lifting the silicon substrates 1. A material of the pad 19 is not especially limited; however, a material excluding a volatile substance is preferable because it is used in a vacuumed apparatus. Also, the material needs to withstand at least up to the temperature raised by heating with plasma.

In order to implement the invention, it is effective to structure in such a manner that the placing surface of the tray 13 for the silicon substrates 1 forms a concave plane as a whole instead of providing the pads 19, so that the thickness of the tray 13 is thicker in the peripheral portion than in the central portion. The concave plane of the tray 13 may be formed by providing a curved plane to the surface of the tray 13 or by forming the tray 13 of a step-like structure comprising a plurality of planes. In a case where the tray 13 forms a step-like structure, it is preferable to apply chamfering to the step portions as is shown in FIG. 8 to reduce the possibility of the occurrence of an abnormal discharge. The chamfering can reduce the possibility of the occurrence of an abnormal discharge induced by protrusions formed at the steps.

Figure 10:
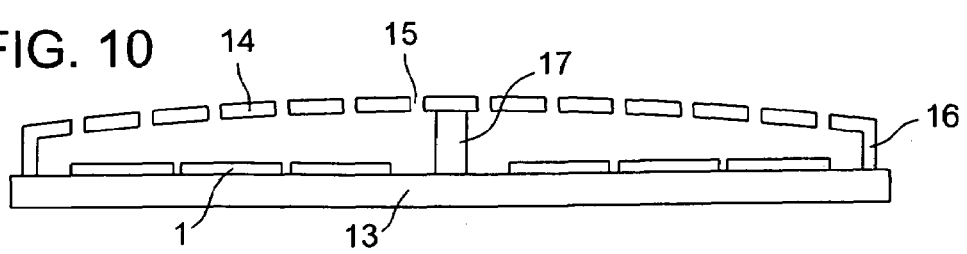
FIG. 10 is a cross section showing a state where still another plate of the invention is provided.

Also, as shown in FIG. 10, it is effective to provide a supporting body 17 between the plate 14 and the tray 13. The supporting body 17 may be fixed to either the plate 14 or the tray 13, or fixed to neither of them. It is preferable that the supporting body 17 is of a simple structure with the smallest possible surface area to reduce the possibility of the occurrence of an abnormal discharge during etching. It is preferable that the supporting body 17 is of a cylindrical structure, for example.

<Shape B Characteristic to Plate>

Figure 11:
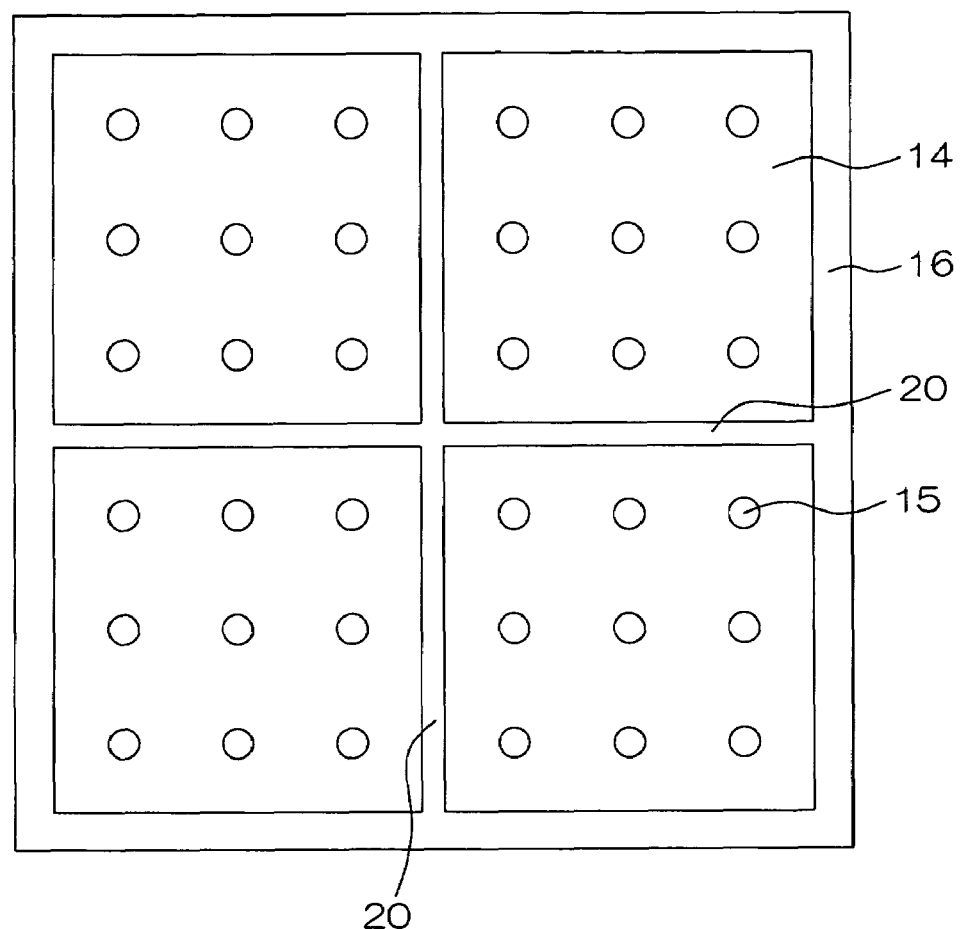
FIG. 11 is a bottom view of still another plate of the invention.
Figure 12:
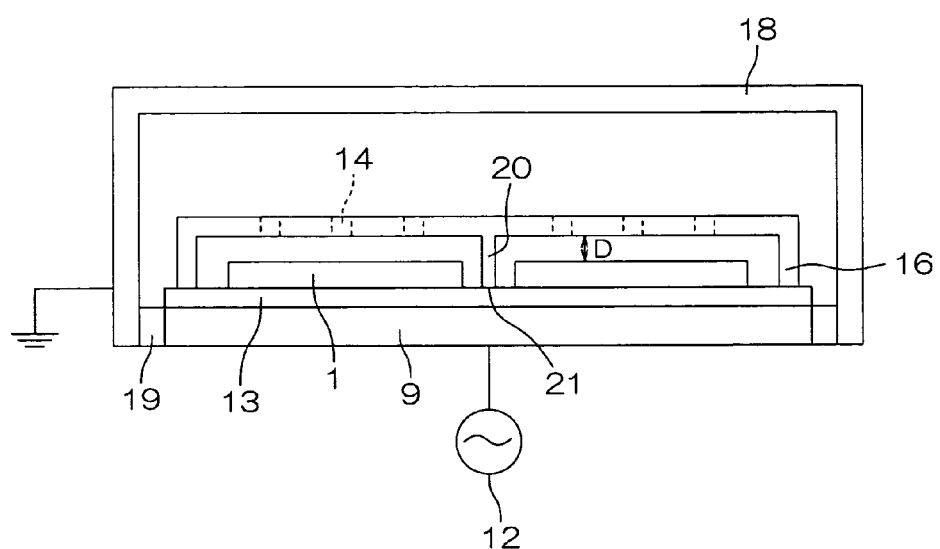
FIG. 12 is a view showing still another basic structure of the dry etching apparatus in a state where the plate is provided.

FIG. 11 is a bottom view of the plate 14 according to another embodiment of the invention. FIG. 12 is a cross section showing the plate 14 provided inside the dry etching apparatus.

A protruding walls 16, 20 are provided to the plate 14 on the surface opposing the substrate 1. This arrangement secures a space above the substrate 1, surrounded by the plate 14, and the protruding walls 16, 20.

The above-mentioned sidewall portion 16 formed around the edge of the plate 14 is denoted "protruding wall 16" here, since it functions a protruding wall of the invention. The protruding wall may be consisted only of the protruding wall 16 formed in a peripheral portion of the plate 14.

By securing a space above the substrate 1 in this manner, a concentration of the silicon residues remaining in the space above the substrate 1, surrounded by the plate 14 and the protruding walls 16, 20, can stay at a constant level even when the substrate area is increased, regardless of the positions and the shapes of the inlet port 18a introducing a gas inside the chamber 18 and the exhaust port 18b. Hence, the residues can adhere to the surface of the substrate 1 homogeneously, and the homogeneity in etching can be thus improved.

As shown in FIG. 11, the protruding walls 16, 20 may be formed in the shape of a cross when the plate 14 is viewed in a plane. According to this arrangement, the region in which the etching residues are trapped is reduced to one fourth of the total, which makes it possible to further improve the homogeneity in etching.

It is preferable not to place the silicon substrate 1 to be etched between the lower end portion 21 of the protruding wall 20 and the electrode 9. This is because a problem is raised when the silicon substrate 1 comes in direct contact with or comes too close to the protruding wall 20 that the silicon substrate 1 is not etched in such a region.

As shown in FIG. 12, it is preferable that the lower end portion 21 of the protruding wall 20 abuts on the electrode 9 or the tray 13. This arrangement can prevent an abnormal discharge between the lower end portion 21 of the protruding wall 20 and the electrode 9.

The protruding walls 16, 20, together with the sidewall portion 16 provided along the periphery of the plate 14, serves well in maintaining the distance D between the plate 14 and the substrate 1. In particular, in a case where a large number of silicon substrates 1 are to be etched and the plate 14 of a large area is needed, the plate 14 warps due to self-weight. In such a case, the presence of the protruding walls 16, 20 is effective to prevent warping of the plate 14.

It should be appreciated that the invention is not limited to the embodiments above. For example, an explanation was given to a bulk silicon solar cell as an example of a substrate to be etched; however, applications of the invention are not limited to the bulk type, and the invention is applicable to a thin-film or amorphous silicon solar cell. A substrate to be etched is not limited to a silicon substrate or a solar cell substrate, either. The invention can be modified in various manners within the scope of the invention.

The invention claimed is:

1. A method for producing a solar cell, comprising:
   placing a substrate for a solar cell on an electrode inside a chamber;
   covering said substrate with a plate, wherein said plate is provided with a number of opening portions; and
   forming textures on a surface of the substrate by using residues generated during etching and being chiefly composed of components of the substrate as an etching mask, wherein a distance between said substrate and a surface of said plate opposing said substrate in a peripheral portion of said plate is set shorter than a distance between said substrate and said surface opposing said substrate in a central portion of said plate.

2. The method for producing a solar cell according to claim 1, wherein said textures are formed by a reactive ion etching method.

3. A method for producing a solar cell, comprising:
   placing a substrate for a solar cell on an electrode inside a chamber;
   covering said substrate with a plate provided with a number of opening portions;
   forming textures on a surface of said substrate using residues generated during etching and being chiefly composed of components of the substrate as an etching mask,
   wherein said plate is provided with a protruding wall on a surface opposing said substrate and said protruding wall is separated from a nearest surface of said substrate by a space.

4. The method for producing a solar cell according to claim 3, wherein said textures are formed by a reactive ion etching method.

5. The method for producing a solar cell according to claim 1, wherein said plate is provided with a protruding wall on a surface thereof opposing said substrate and said protruding wall is separated from a nearest surface thereof opposing said substrate and said protruding wall is separated from a nearest surface of said substrate by a space.

6. The method for producing a solar cell according to claim 3, wherein a lower end portion of said protruding wall abuts on said electrode.

7. The method for producing a solar cell according to claim 3, wherein the substrate for a solar cell is a silicon substrate.

* * * * *